United States Patent
Alberth, Jr. et al.

(10) Patent No.: US 10,334,898 B2
(45) Date of Patent: Jul. 2, 2019

(54) RADIO FREQUENCY SHIELDED CLOTHING

(71) Applicants: William P. Alberth, Jr., Prairie Grove, IL (US); John Cipolla, Inverness, IL (US)

(72) Inventors: William P. Alberth, Jr., Prairie Grove, IL (US); John Cipolla, Inverness, IL (US)

(*) Notice: Subject to any disclaimer, the term of this patent is extended or adjusted under 35 U.S.C. 154(b) by 533 days.

(21) Appl. No.: 15/131,988

(22) Filed: Apr. 18, 2016

(65) Prior Publication Data
US 2016/0227856 A1    Aug. 11, 2016

Related U.S. Application Data

(63) Continuation of application No. 14/057,249, filed on Oct. 18, 2013, now Pat. No. 9,362,618.

(60) Provisional application No. 61/715,583, filed on Oct. 18, 2012.

(51) Int. Cl.
| | |
|---|---|
| *A41D 27/20* | (2006.01) |
| *A41D 1/06* | (2006.01) |
| *H05K 9/00* | (2006.01) |
| *H01Q 17/00* | (2006.01) |
| *A41D 3/00* | (2006.01) |
| *A41B 1/08* | (2006.01) |
| *H01Q 1/24* | (2006.01) |
| *H01Q 1/52* | (2006.01) |
| *H01Q 15/14* | (2006.01) |
| *A41D 1/00* | (2018.01) |
| *A41D 27/00* | (2006.01) |

(52) U.S. Cl.
CPC .............. *A41D 27/205* (2013.01); *A41B 1/08* (2013.01); *A41D 1/06* (2013.01); *A41D 3/00* (2013.01); *H01Q 1/245* (2013.01); *H01Q 1/526* (2013.01); *H01Q 15/14* (2013.01); *H01Q 17/00* (2013.01); *H01Q 17/005* (2013.01); *H01Q 17/008* (2013.01); *H05K 9/0043* (2013.01); *H05K 9/0081* (2013.01); *A41D 1/002* (2013.01)

(58) Field of Classification Search
USPC ....................................................... 250/516.1
See application file for complete search history.

(56) References Cited

U.S. PATENT DOCUMENTS

| | | | | |
|---|---|---|---|---|
| 2,285,083 | A * | 6/1942 | Cover, Sr. .............. | H04B 1/385 455/100 |
| 3,039,172 | A * | 6/1962 | Egan .................... | H01Q 17/005 342/1 |
| 3,349,396 | A * | 10/1967 | Reed ........................ | F41H 3/02 342/3 |

(Continued)

FOREIGN PATENT DOCUMENTS

| | | | | |
|---|---|---|---|---|
| CN | 202035510 U | * | 11/2011 | .......... A41D 27/205 |
| DE | 29616182 U1 | * | 12/1996 | .......... A41D 27/205 |
| WO | WO 99/40808 A1 | * | 8/1999 | .......... A41D 27/205 |

*Primary Examiner* — Bernarr E Gregory
(74) *Attorney, Agent, or Firm* — Loppnow & Chapa; Matthew C. Loppnow

(57) ABSTRACT

Clothing for shielding a person from radio frequency energy relating to an electronic device includes a garment adapted to be worn by the person that includes at least one pocket having an inner panel and an outer panel. The pocket is sized to bold the electronic device. The inner panel of the pocket includes an electrically conductive shield material.

20 Claims, 2 Drawing Sheets

(56) References Cited

U.S. PATENT DOCUMENTS

| | | | | |
|---|---|---|---|---|
| 4,064,305 A * | 12/1977 | Wallin | F41H 3/02 |
| | | | 442/308 |
| 4,420,757 A * | 12/1983 | Ebneth | H01Q 15/14 |
| | | | 342/5 |
| 4,572,960 A * | 2/1986 | Ebneth | A41D 31/0072 |
| | | | 250/516.1 |
| 5,103,504 A * | 4/1992 | Dordevic | G21F 3/02 |
| | | | 139/425 R |
| 5,115,140 A * | 5/1992 | Rodriguez | G21F 3/02 |
| | | | 174/388 |
| 5,950,237 A * | 9/1999 | Micheron | F41H 1/02 |
| | | | 2/2.5 |
| 6,788,262 B1 * | 9/2004 | Adams | H01Q 1/273 |
| | | | 343/718 |
| 6,795,975 B2 * | 9/2004 | Marmaropoulos | H01Q 1/273 |
| | | | 2/69 |
| 6,972,725 B1 * | 12/2005 | Adams | H01Q 1/273 |
| | | | 343/718 |
| 8,013,776 B2 * | 9/2011 | Child | H01Q 17/005 |
| | | | 342/1 |
| 8,410,461 B2 * | 4/2013 | Slinkard | A61N 1/16 |
| | | | 2/69 |
| 8,898,816 B2 * | 12/2014 | Highfield | A41D 1/002 |
| | | | 2/247 |
| 2011/0016615 A1 * | 1/2011 | Massey | A41D 27/205 |
| | | | 2/251 |
| 2012/0047631 A1 * | 3/2012 | Connolly | A41D 27/205 |
| | | | 2/272 |
| 2012/0060261 A1 * | 3/2012 | Raviv | A41D 27/205 |
| | | | 2/252 |
| 2012/0114270 A1 * | 5/2012 | Roberts | H05K 9/0043 |
| | | | 383/109 |
| 2012/0185999 A1 * | 7/2012 | Raviv | A41D 27/205 |
| | | | 2/247 |
| 2012/0186000 A1 * | 7/2012 | Raviv | A41D 27/205 |
| | | | 2/247 |

* cited by examiner

RADIO FREQUENCY SHIELDED CLOTHING

CLAIM OF PRIORITY

This application is a continuation of U.S. patent application Ser. No. 14/057,249, filed on Oct. 18, 2013, now U.S. Pat. No. 9,362,618, which claims priority to U.S. Provisional Patent Application No. 61/715,583, filed Oct. 18, 2012, the contents of which are hereby incorporated by reference.

FIELD OF THE INVENTION

The present invention relates generally to protective clothing and, in particular, to clothing featuring shielding to protect the wearer against radio frequency energy.

BACKGROUND

Users of cell phones, smart phones, personal digital assistants and the like typically carry the electronic devices in clothing pockets. While there is no evidence that radiation from such devices cause an adverse health effects, many individuals believe that less radiation exposure is better. The prior art lacks clothing augmented with one or more shields to reduce radio frequency (RE) energy incident on the user.

The prior art discloses use of shielding for hoods worn around large electrical equipment and discusses the effect of slots in shielded enclosures. In addition, full chainmail suits are used by high voltage electrical workers to prevent a voltage differential from developing across the workers' bodies in proximity to the live line. Purses, wallets and credit card sleeves are also on the market to prevent undesired scanning of credit cards or passports using NFC.

In addition, smart phone eases that are both decorative and protective are known. Such cases are not made with shields to reduce RF energy on the user, however, and instead are typically constructed from a plastic or rubber material. Some cases require the user to open or remove the electronic device prior to use, which is often inconvenient or awkward.

A need exists, however, for clothing that provides protection for the wearer against RF energy when the wearer stores cell phones, smart phones, personal digital assistants and other electronic devices in his or her pockets.

DETAILED DESCRIPTION OF EMBODIMENTS

Figure 1:
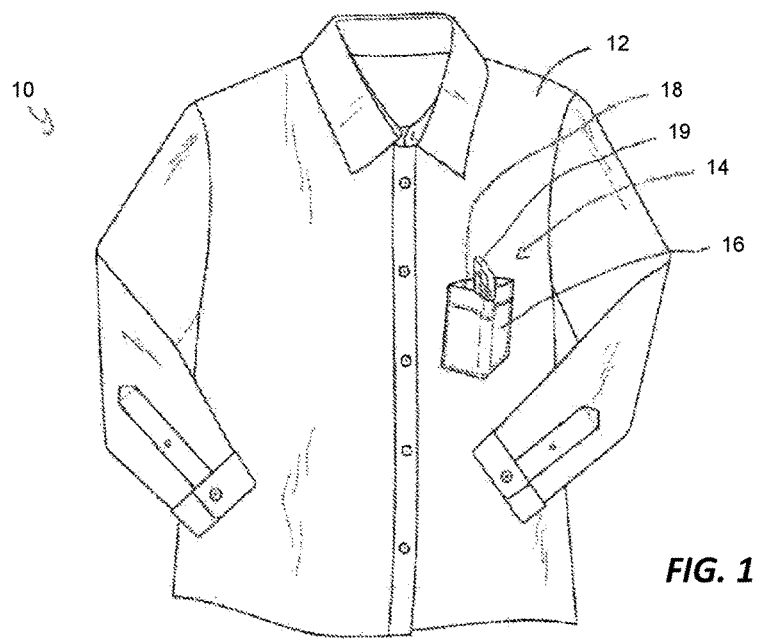
FIG. 1 is a front perspective view of a shirt provided with an embodiment of the clothing shield of the invention.
Figure 2:
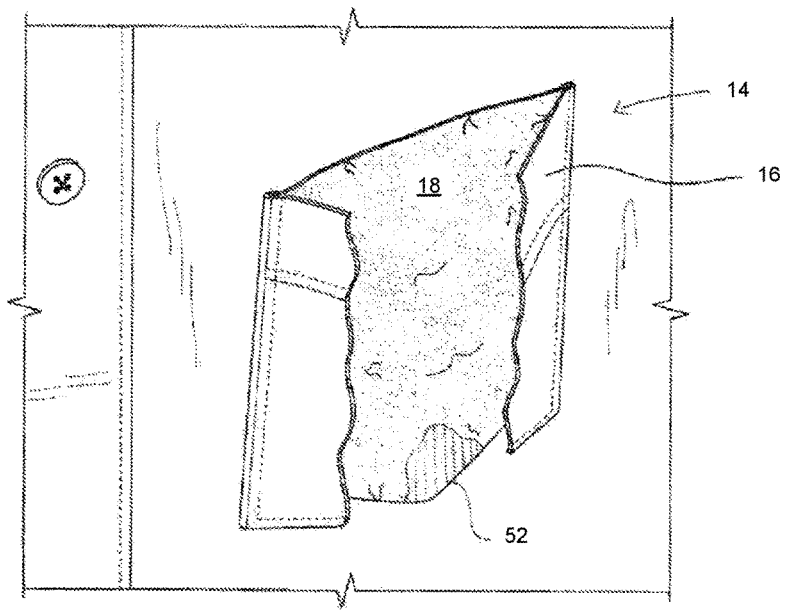
FIG. 2 is an enlarged front partial sectional view of the clothing shield of FIG. 1.

In accordance with an embodiment of the present invention, a shield layer is applied to the pocket of an article of clothing As an example, with reference to FIG. 1, a shirt, indicated in general at 10, features a chest panel 12 that is provided with a pocket, indicated in general at 14. As illustrated in FIGS. 1 and 2, the pocket 14 includes an outer panel 16 that is attached to the chest panel 12 along the side and bottom edges. An inner panel of the pocket is formed by the chest panel 12 of the shirt and is provided with shield material 18 described below. The pocket 14 is sized so that a cell phone, smart phone, personal digital assistant or other mobile device 19 may be placed and carried therein.

Figure 3:
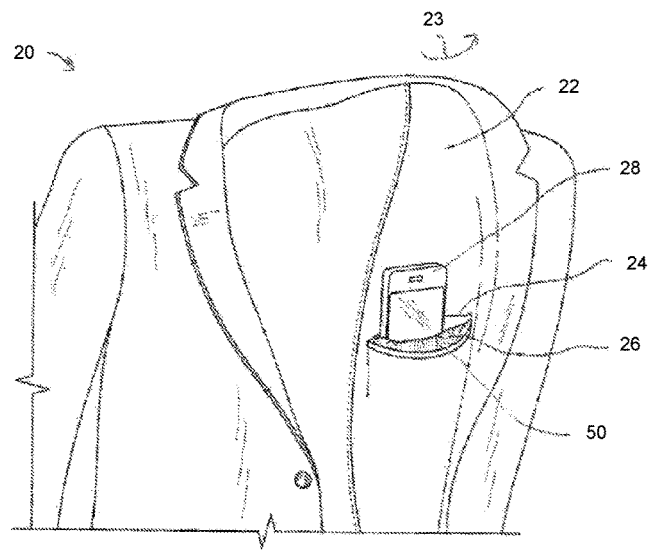
FIG. 3 is a partial front perspective view of a jacket provided with an embodiment of the clothing shield of the invention.

With reference to FIG. 3, a jacket, indicated in general at 20, is shown with the interior of the left front flap of the jacket exposed (i.e. the left front flap of the jacket is flipped open in the direction of arrow 23) so as to reveal an interior panel 22 provided with a pocket 24. The pocket 24 is lined with shield material 26 (described below) and may be sized so that a cell phone, smart phone, personal digital assistant or other mobile device 28 may be placed and carried therein. file inner panel of the inner pocket 24 is lined with the shield material so that the shield material 26 is sandwiched between the electronic device and the wearer's shirt when the jacket is closed or worn.

Figures 4A, 4B:
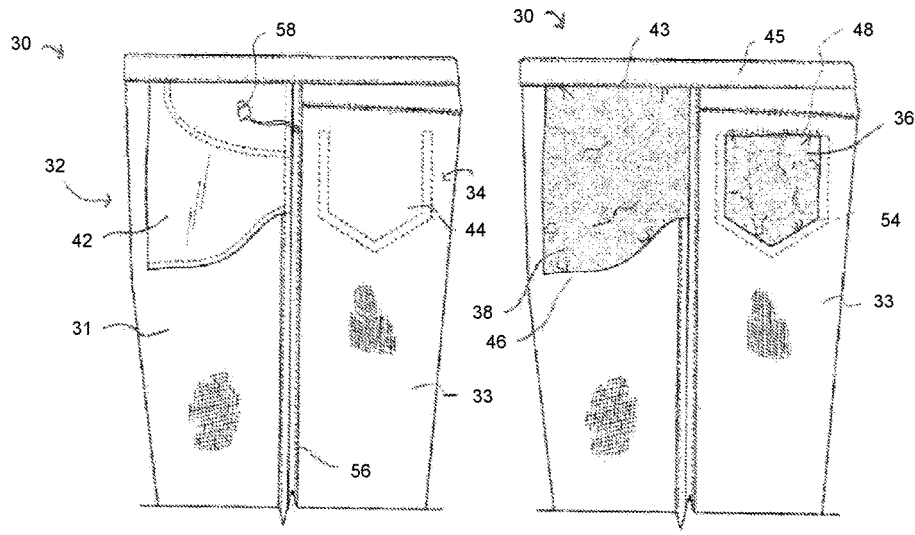
FIGS. 4A and 4B are partial side elevational views of a pair of pants provided with an embodiment of the clothing shield of the present invention, where the pants are turned inside out and where the front and rear pocket outer panels are omitted in FIG. 4B.

With reference to FIGS. 4A and 4B, a pair of jeans, indicated in general at 30 and illustrated inside out, features a front panel 31 provided with a front pocket indicated in general at 32, and a rear panel 33 provided with a rear pocket, indicated in general at 34. As illustrated in FIG. 4A, the front pocket features a front pocket outer panel 42, and the rear pocket features a rear pocket outer panel 44. As illustrated in FIG. 4B. where the front and rear pocket outer panels arc omitted, the front pocket features a front pocket inner panel 46 sewed across the top 43 to the waist 45 of the jeans and around the sides and bottom peripheries to the front pocket outer panel 42 (so that the top is left open for access). As also shown in FIG. 4B, the front pocket inner panel 46 is lined with shield material 38. The rear pocket uses the rear panel 33 as the rear pocket inner panel, and it is similarly lined with shield material 36. The shield material is described below. Thus, when a mobile phone or other device is placed within the pocket of a worn garment, the shield material will be between the user and the device.

In one embodiment an additional layer of material may be added so that the shield material is sandwiched between two layers of material such as the material used for the pocket panel 42. The result would be a pocket where a person wearing or holding the garment would be unable to touch at least some of the shield material. This allows the manufacturer of the garment to control the texture of the garment and still include the shield, material in the construction.

Other pocket constructions used for clothing known in the art may be incorporated into the present invention, as long as the panels of the pockets lined with the shield material are chosen so that, the shield material is sandwiched between the electronic, device and the wearer's skin, underwear or inner layers of additional clothing when worn.

The shield, layer or material of the embodiments of FIGS. 1-4B, and other embodiments, may be a conductive textile, a semi-conductive textile, or a coating to the existing fabric such as HONTEX, available from Econyx Corporation of Pinole, Calif. The shield may also be a mesh made of conductive material, or coated with conductive material including, but not limited to, a metallic material.

The pocket itself may be constructed of textile material that is conductive, a layer of conductive material may be added to an existing pocket, a layer of conductive glue or paint may be applied to the material, a layer may be attached with an adhesive or sewn to the pocket material. The shield material could also be riveted in place so as to be situated between a user and a pocket, In addition to the embodiments illustrated in FIGS. 1-4B, the pocket may be a skirt pocket, vest pocket, overcoat pocket, ski bib pocket, backpack pocket, pocket in shoes (which may receive an electronic, device such as a pedometer). The pocket may be part of an arm band designed to hold a music player during a work out. The pocket may be in gloves (such as the back of a glove designed to receive a heating pad or an electronic sensor). The pocket may be in a chest strap designed to receive a health monitor.

A preferred embodiment of the invention is implemented by shielding one panel of the pocket, to allow a mobile device to receive and send signals, and to reduce the amount of radiation incident on the user. However, some pockets may be shielded on both the inner and outer panels, for purposes of reducing the ability of nefarious reading of NFC enabled credit cards, passports, tickets, badges, and other documents.

As indicated by the prior art, slots, in shields can greatly reduce the effectiveness of the shield. This is because the slot can act as an antenna and re-radiate energy that impinges on the shield material, This effect may occur on the edges of the pocket shield material. To mitigate this effect. an embodiment of the invention would fray the edges, as illustrated at 48 in FIG. 4B, or add a resistive layer to the shield, or fold or wrap the material partially around the edge of the pocket opening (as illustrated at 50 in FIG. 3), Fraying the edges prevents the edge of the shield material from forming a clean edge which can efficiently radiate. The edge may also be formed or cut irregularly. Folding the material partially around the pocket moves the edge away from the user.

Adding a resistive layer which has lower conductivity than the shield but is not an insulator can also disrupt RF fields and result in higher effective shielding. The lower conductivity layer is preferably added between the shield layer and the wearer of the garment, as illustrated at 52 in FIG. 2. Examples of the material suitable for the resistive layer include Staticot Shielding Fabric, available from Less EMF Inc. of Latham, N.Y. In some embodiments, the shielding layer may be implemented with a layer of resistive material.

If the conductive shield material is applied to the textile, the material may be applied at a first density in the central area of the pocket, such as the area indicated in phantom at 54 in FIG. 4B, where the device is expected to be maintained. The edges of the shield area, i.e. the area of the shield outside of area 54 of FIG. 4B, may have the conductive material applied at a lower density (which will result in less conductivity) thus creating a higher conductivity area in the center of the shield, and a lower conductivity area on the border of the shield. Another method is to fold the edges of the shield partially around the pocket, moving the edges away from the user (as illustrated in FIG. 3).

Adding conductive materials to an article of clothing provides opportunities for farther uses. For example, an antenna structure may be added to clothing The antenna structure preferably uses a radiated element to connect it to the mobile device in the pocket. An antenna is preferably constructed to ha near a multiple of ¼ of the wavelength of the intended frequency of operation. The antenna may be constructed out of conductive thread, or may be applied as a conductive coating. The antenna structure could run down the pants leg of a pair of pants, as in the case of the antenna illustrated at 56 in FIG. 4A and connect to the electronic device via connector 58.

The antenna may be connected to a conductive patch applied to the pocket on the side distal to the uses. The connection may be established using conductive material in the form of a transmission line such as suspended stripline. The connection may also be established with microcoaxial cable connected to the antenna and to the conductive patch. The patch re-radiates the small collected signal directly over the device. As the mobile device sits in the pocket, the distributed antenna in the garment can collect the weak signal from the base station, and re-radiate it to the mobile device, facilitating reception in marginal coverage areas.

The pocket may be designed to hold a mobile device and properly positioning the device to maximize coupling between the patch and the antenna in the mobile device.

In summary, for the dress shirt pocket (FIGS. 1 and 2), the shield may go inside the pocket and attach to the panel closest to the wearer. Optionally, the shield would wrap around the inside of the pocket a little bit to keep most of the shield edges away from the user. For the jacket pocket (or overcoat pocket), as illustrated in FIG. 3, the shield could go in the pocket, secured to the pocket wall closest to the user, or it could be inside the jacket attached to the pocket. Jackets have multiple layers within which the shield layer may he hidden. FIG. 3 illustrates the shield inside breast pocket, but it is equally applicable to the outside breast pocket, or the side pockets (inside or outside).

While the preferred embodiments of the invention have been shown and described, it will be apparent to those skilled in the art that changes and modifications may be made therein without departing from the spirit of the invention, the scope of which is defined by the appended claims.

What is claimed is:

1. Clothing for shielding at least a portion of a person from radio frequency energy relating to an electronic device comprising:
   a) a garment adapted to be worn by the person;
   b) said garment including at least one pocket having an inner panel and an outer panel, said pocket sized to hold the electronic device; and
   c) said inner panel of the pocket including a shield comprising shield material,
      wherein an edge of the shield is at least one of: frayed; formed with an irregular edge; and/or cut so that the edge is irregular, preventing the edge of the shield material from forming an efficiently radiating clean edge.

2. The clothing of claim 1 wherein the pocket includes an opening, and a portion of the shield material wraps around an edge of the opening.

3. The clothing of claim 1 wherein the outer panel also includes shield material.

4. The clothing of claim 1 wherein the shield material includes a metallic material.

5. The clothing of claim 1 wherein the shield material is electrically conductive.

6. The clothing of claim 1 wherein the shield material is a layer and further comprising a resistive layer that has a lower conductivity than the shield layer, said resistive layer positioned between the shield layer and the person wearing the clothing.

7. The clothing of claim 1 wherein the shield material is lined with a cloth layer on at least one side.

8. The clothing of claim 1 wherein the electrically conductive shield material is sprayed onto the panel of the pocket.

9. The clothing of claim 8 wherein a density of the spray is a first non-zero value in a central area of the shield material and where the density of the spray is a second non-zero value in an area bordering the central area of the shield material, where the second density value is less than the first density value.

10. The clothing of claim 1 wherein the shield material is sandwiched between two fabric layers.

11. The clothing of claim 1 further comprising a conductor tuned as an antenna for at least one frequency used by the electronic device stored in the pocket.

12. The clothing of claim 1 wherein the garment is a shirt having a chest panel, and wherein the inner panel of the pocket is a portion of the chest panel.

13. The clothing of claim 1, where the shield material is a layer positioned over the inner panel of the pocket.

14. The clothing of claim 13 wherein the layer of shield material is sewn onto the inner panel.

15. The clothing of claim 13 wherein the layer of shield material is secured onto the inner panel by adhesive.

16. The clothing of claim 13 wherein the layer of shield material is riveted to the inner panel.

17. The clothing of claim 1 wherein the garment is a pair of pants having a rear panel, where the inner panel of the pocket is formed by a portion of the rear panel of the pair of pants.

18. The clothing of claim 1 wherein the garment is a jacket having a pocket with at least one panel lined with a shield material, and the pocket is positioned within an interior panel of the jacket.

19. Clothing for shielding a person from radio frequency energy relating to an electronic device comprising:
   a garment adapted to be worn by the person;
   said garment including at least one pocket having an inner panel and an outer panel, said pocket sized to hold the electronic device; and
   said inner panel of the pocket including a shield material, the shield material shielding a person from radio frequency energy relating to an electronic device, the shield material including a shield edge, where the shield material is folded partially around the pocket to move the shield edge away from the person.

20. The clothing of claim 19, wherein an edge of the shield is formed with an irregular edge, preventing the edge of the shield material from forming an efficiently radiating clean edge.

* * * * *